US007902595B2

(12) United States Patent
Adan et al.

(10) Patent No.: US 7,902,595 B2
(45) Date of Patent: Mar. 8, 2011

(54) POWER IC DEVICE AND METHOD OF MANUFACTURING SAME

(75) Inventors: Alberto O. Adan, Ikoma (JP);
Mitsuhiro Kikuta, Kyotanabe (JP);
Akinobu Teramoto, Sendai (JP);
Tadahiro Ohmi, Sendai (JP); Hiroo Yabe, Susono (JP); Takanori Watanabe, Susono (JP)

(73) Assignees: Sharp Kabushiki Kaisha, Osaka (JP);
National University Corporation Tohoku University, Miyagi (JP); Yazaki Corporation, Tokyo (JP)

( * ) Notice: Subject to any disclaimer, the term of this patent is extended or adjusted under 35 U.S.C. 154(b) by 44 days.

(21) Appl. No.: 12/308,057

(22) PCT Filed: May 31, 2007

(86) PCT No.: PCT/JP2007/061054
§ 371 (c)(1),
(2), (4) Date: Feb. 3, 2009

(87) PCT Pub. No.: WO2007/142107
PCT Pub. Date: Dec. 13, 2007

(65) Prior Publication Data
US 2009/0302382 A1    Dec. 10, 2009

(30) Foreign Application Priority Data
Jun. 7, 2006 (JP) .................. 2006-158374

(51) Int. Cl.
*H01L 29/66* (2006.01)
*H01L 21/8239* (2006.01)

(52) U.S. Cl. .......... 257/328; 257/E21.705; 257/E21.614; 438/212

(58) Field of Classification Search ................. 257/334, 257/342, 347, 401, 328, E21.702, E21.614, 257/E21.705, E21.604; 438/212, 199, 291
See application file for complete search history.

(56) References Cited

U.S. PATENT DOCUMENTS

| 4,795,716 A | 1/1989 | Yilmaz et al. |
| 6,551,900 B1 * | 4/2003 | Chung et al. ................. 438/424 |
| 2002/0158277 A1 * | 10/2002 | Harada et al. ................. 257/288 |
| 2004/0108575 A1 | 6/2004 | Ohmi et al. |
| 2006/0138538 A1 * | 6/2006 | Ohmi et al. ................. 257/341 |
| 2007/0145535 A1 | 6/2007 | Ohmi et al. |

FOREIGN PATENT DOCUMENTS

| JP | 64-076755 | 3/1989 |
| JP | 7-231088 | 8/1995 |
| JP | 2002/359294 | 12/2002 |
| JP | 2004-200672 | 7/2004 |
| JP | 2004-356114 | 12/2004 |
| WO | WO2004105116 | * 12/2004 |

OTHER PUBLICATIONS

K. Sato et al., "Roughening of Single-Crystal Silicon Surface etched by Koh Water Solution", Sensors and Actuators, A Physical, 1999, pp. 122-130, vol. 73, Elsevier, U.K., U.S.

* cited by examiner

*Primary Examiner* — Thomas L Dickey
*Assistant Examiner* — Nikolay Yushin
(74) *Attorney, Agent, or Firm* — Harness, Dickey & Pierce, P.L.C.

(57) ABSTRACT

In one embodiment of the present invention, a power IC device is disclosed containing a power MOS transistor with a low ON resistance and a surface channel MOS transistor with a high operation speed. There is also provided a method of manufacturing such a device. A chip has a surface of which the planar direction is not less than −8° and not more than +8° off a silicon crystal face. The p-channel trench power MOS transistor includes a trench formed vertically from the surface of the chip, a gate region in the trench, an inversion channel region on a side wall of the trench, a source region in a surface layer of the chip, and a drain region in a back surface layer of the chip. The surface channel MOS transistor has an inversion channel region fabricated so that an inversion channel current flows in a direction not less than −8° and not more than +8° off the silicon crystal direction.

21 Claims, 9 Drawing Sheets

BACKGROUND ART

POWER IC DEVICE AND METHOD OF MANUFACTURING SAME

TECHNICAL FIELD

The present invention relates generally to power IC (Integrated Circuit) devices including a p-channel trench power MOS (Metal Oxide Semiconductor) transistor and a surface channel MOS (Metal Oxide Semiconductor) transistor.

The present invention relates in particular to a power IC device including, in a single chip, a p-channel trench power MOS (Metal Oxide Semiconductor) transistor used, for example, primarily for power supply, high voltage/high current switching for power supply conversion, or load switching for relaying and a surface channel MOS transistor used, for example, for the control of that transistor and also to a method of manufacturing such a device.

Throughout this document, the surface channel MOS transistor refers to the MOS transistor that has a channel current flowing parallel to the chip surface.

BACKGROUND ART

Power IC (Integrated Circuit; semiconductor integrated circuit) devices have been evolving for power management and power control through integration with high current/high voltage compatible power MOS (Metal Oxide Semiconductor) transistors and their control circuits.

Some essential properties of the power IC device include low manufacturing cost, low ON resistance, and high operation speed. Low ON resistance is required in order to achieve low voltage drop when the power IC device is used, for example, in a high drive circuit which allows only for extremely low ON voltage drop.

Figure 10:
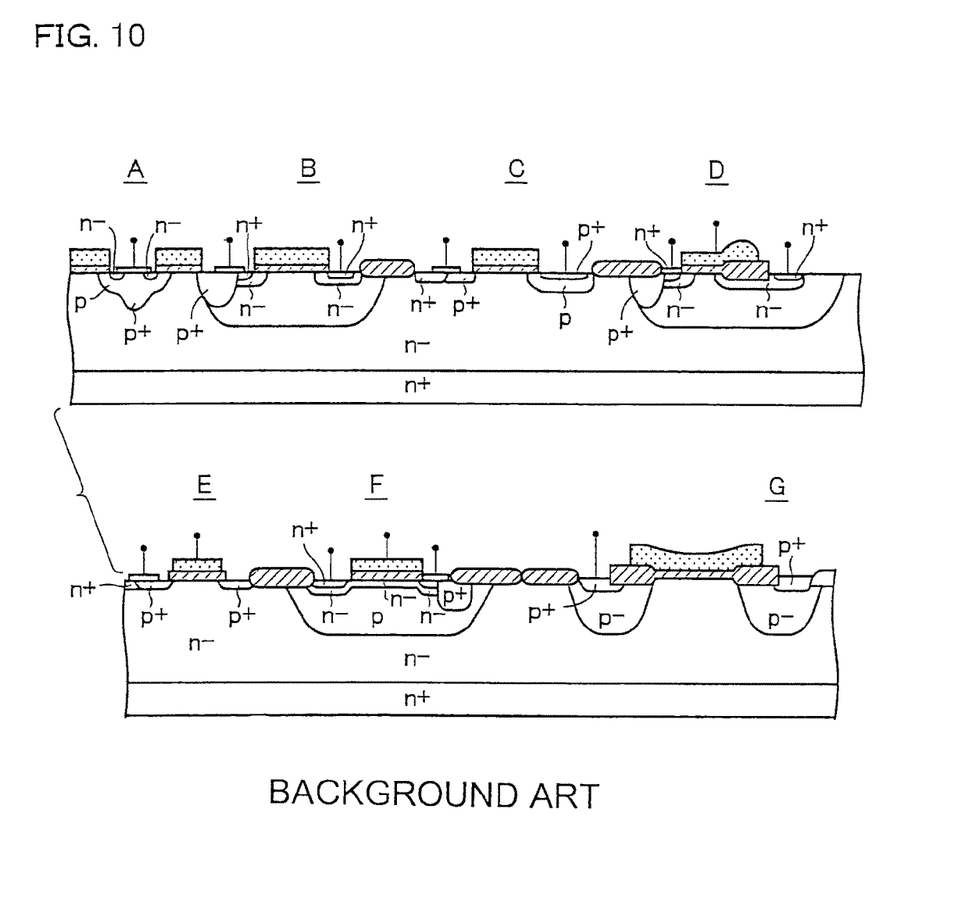
FIG. 10 Cross-sectional views of a major part of a conventional IC device.

Accordingly, patent document 1 discloses, as illustrated in FIG. 10, a power IC device structure integrating a DMOS (Double Diffused Metal Oxide Semiconductor) transistor as a power MOS transistor and a surface channel MOS transistor as a control circuit for the DMOS transistor. The surface channel MOS transistor has a structure including wells, sources and drains, a gate insulating film, and gates which are sequentially formed in the surface layer of a chip and is fabricable by general MOS transistor fabrication technology.

The power MOS transistor in the power IC device needs to be a p-channel power MOS transistor to achieve low manufacturing cost, one of the listed requirements, for the following reasons. The n-channel power MOS transistor needs an overdrive circuit supplying higher gate voltage than power supply voltage when connected (gate step-up circuit). On the other hand, the p-channel power MOS transistor needs no gate step-up circuit.

Patent Document 1: U.S. Pat. No. 4,795,716, Specification (Jan. 3, 1989)
Patent Document 2: Japanese Unexamined Patent Publication No. 2004-356114 (Tokukai 2004-356114; published Dec. 16, 2004)
Patent Document 3: Japanese Unexamined Patent Publication No. 2004-200672 (Tokukai 2004-200672; published Jul. 15, 2004)
Non-patent Document 1: Roughening of Single-Crystal Silicon Surface etched by KOH Water Solution, K. Sato et al, Sensors and Actuators, A PHYSICAL, U.K., U.S., ELSEVIER, 1999, Vol. 73, pp. 122-130

DISCLOSURE OF INVENTION

The conventional power IC device and its manufacturing method realizes low manufacturing cost by the use of the p-channel power MOS transistor. However, the device and method is short of achieving the other requirements. The ON resistance is not sufficiently low. The operation speed is slow in the surface channel MOS transistor.

One cannot obtain low ON resistance with the p-channel power MOS transistor for the following reasons.

Silicon wafers available on the market have a silicon crystal (100) orientation surface. In a typical p-channel power MOS transistor made from such a silicon wafer, channel current flows in the silicon crystal <100> direction. When the channel current flows in the silicon crystal <100> direction in the p-channel power MOS transistor, mobility is not sufficiently high, leading to high ON resistance.

The same phenomenon occurs in the p-channel trench power MOS transistor used as the p-channel power MOS transistor.

In the trench power MOS transistor with trenches formed vertically into a silicon wafer which has a silicon crystal (100) orientation surface, channel current flows from the source to the drain, that is, from an upper layer to a lower layer, in the silicon wafer. This direction is the silicon crystal <100> direction as in the preceding case. Mobility is therefore not sufficiently high, leading to high ON resistance.

The operation speed is slow in the surface channel MOS transistor in the power IC device for the following reasons.

The surface channel MOS transistor is, as mentioned earlier, fabricable by general MOS transistor fabrication technology. If the surface channel MOS transistor is made on a crystal (100) face of a silicon wafer, inversion channel current in a typical p-type surface channel MOS transistor flows in the silicon crystal <100> direction. Hole mobility is therefore low in the p-channel region, leading to slow operation speed.

With the surface channel MOS transistor with a slow operation speed constituting, for example, a logic circuit, the power IC device exhibits a low overall speed.

Patent documents 2 and 3 disclose mobility enhancement technology for non-integrated MOS transistors to address these problems. The technology, however, is not intended to improve simultaneously the mobilities of multiple MOS transistors, having different functions, which are integrated in a single chip. In other words, the technology fails to improve simultaneously the mobilities of an integrated power MOS transistor and surface channel MOS transistor.

The present invention, conceived in view of these problems, has an objective of providing a power IC device containing a power MOS transistor with a low ON resistance and a surface channel MOS transistor with a high operation speed and also a method of manufacturing such an power IC device.

A power IC device according to the present invention is, to address the problems, characterized by including a surface channel MOS transistor and a p-channel trench power MOS transistor formed in a single chip, the chip having a surface with a planar direction not less than −8° and not more than +8° off a silicon crystal (110) face, wherein: the p-channel trench power MOS transistor includes a trench formed vertically from the surface of the chip so that at least one of side walls of the trench has a planar direction not less than −8° and not more than +8° off the silicon crystal (110) face, a gate region formed in the trench, a trench power MOS transistor inversion channel region formed on a side wall part of the trench, a source region provided in a surface layer of the chip above the trench power MOS transistor inversion channel region, the source region being insulated from the gate region by a gate insulating film, and a drain region provided in a back surface layer of the chip below the trench power MOS transistor inversion channel region; a current from the source region to the drain region flows in the trench power MOS transistor inversion channel region in a direction not less than −8° and not more than +8° off a silicon crystal <110> direction; and the surface channel MOS transistor includes a surface channel MOS transistor inversion channel region formed so that an inversion channel current flows in a surface part of the chip parallel to the surface of the chip.

A method of manufacturing a power IC device according to the present invention is, to address the problems, characterized in that the power IC device includes a surface channel MOS transistor and a p-channel trench power MOS transistor formed in a single chip and in that the method includes the steps of: preparing a silicon wafer having a surface with a planar direction not less than −8° and not more than +8° off a silicon crystal (110) face; in manufacture of the p-channel trench power MOS transistor, forming a trench vertically from the surface of the silicon wafer so that at least one of side walls of the trench has a planar direction not less than −8° and not more than +8° off the silicon crystal (110) face; forming a gate region in the trench; forming a trench power MOS transistor inversion channel region on a side wall part of the trench; forming a source region in a surface layer of the silicon wafer above the trench power MOS transistor inversion channel region, the source region being insulated from the gate region by a gate insulating film; forming a drain region in a back surface layer of the silicon wafer below the trench power MOS transistor inversion channel region, a current from the source region to the drain region flowing in the trench power MOS transistor inversion channel region in a direction not less than −8° and not more than +8° off a silicon crystal <110> direction; and in manufacture of the surface channel MOS transistor, forming a surface channel MOS transistor inversion channel region so that an inversion channel current flows parallel to the surface of the silicon wafer.

The silicon crystal (110) face refers to a face that is parallel to the z-axis and that intercepts the x-axis at 1 and the y-axis at 1. The silicon crystal (110) face may refer to a face equivalent to that face. The silicon crystal (100) face (mentioned later) refers, with respect to the silicon crystal axes (x-, y-, and z-axes), to a face that is parallel to the x and y-axes and also to a face equivalent to that face (a face that is parallel to the y- and z-axes and a face that is parallel to the z- and x-axes).

Figure 2:
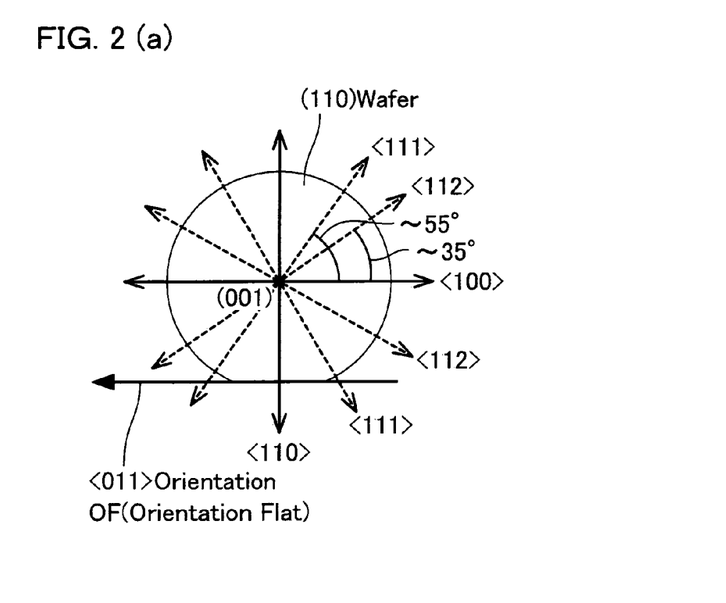
FIG. 2(a) A plan view illustrating crystal directions of a silicon wafer.
FIG. 2(b) A partial oblique view illustrating crystal directions of a silicon wafer.

The silicon crystal <110> direction refers to the direction of a normal to a silicon crystal (110) face or to a face equivalent to the silicon crystal (110) face. The silicon crystal <100> direction refers to the direction of a normal to a silicon crystal (100) face or to a face equivalent to the silicon crystal (100) face. FIGS. 2(a) and 2(b) shows a relationship between crystal faces and crystal directions.

A face that has a planar direction not less than −8° and not more than +8° off a silicon crystal (110) face refers to a face the normal of which crosses the normal to the silicon crystal (110) face at 8° or a smaller angle.

The direction not less than −8° and not more than +8° off the silicon crystal <110> direction refers to a direction that crosses the silicon crystal <110> direction at 8° or a smaller angle.

According to the invention above, the current in the inversion channel region of the p-channel trench power MOS transistor flows in the silicon crystal <110> direction ±8°. That lowers the ON resistance of the power MOS transistor.

To describe it in more detail, the p-channel trench power MOS transistor inversion channel region of the power IC device according to the present invention is provided on a side wall part of the trench (vertical inversion channel region). The source region and the drain region are formed, flanking the trench power MOS transistor inversion channel region, in the upper and lower parts of the silicon wafer respectively. Therefore, the current induced in the inversion channel region flows in the thickness direction of the silicon wafer.

The p-channel trench power MOS transistor according to the present invention is formed on a silicon wafer having, as a surface, a face which falls within ±8° off a silicon crystal (110) face. Therefore, the thickness direction of the silicon wafer is the silicon crystal <110> direction ±8°.

Therefore, the current in the inversion channel region flows in the silicon crystal <110> direction ±8°.

Figure 3:
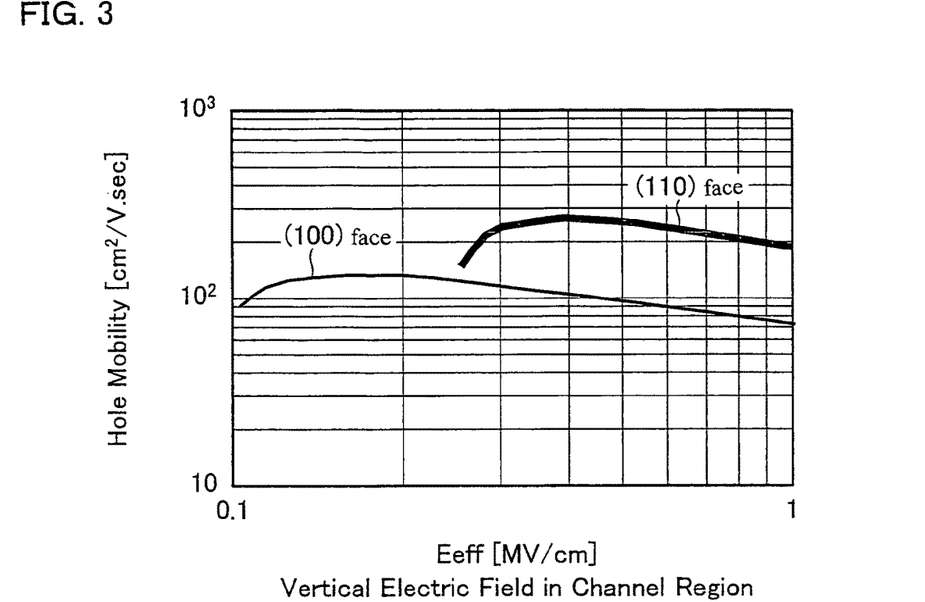
FIG. 3 A graph representing hole mobilities on a silicon crystal (100) face and a silicon crystal (110) face of the silicon wafer on which the power IC device is fabricated.
Figure 4:
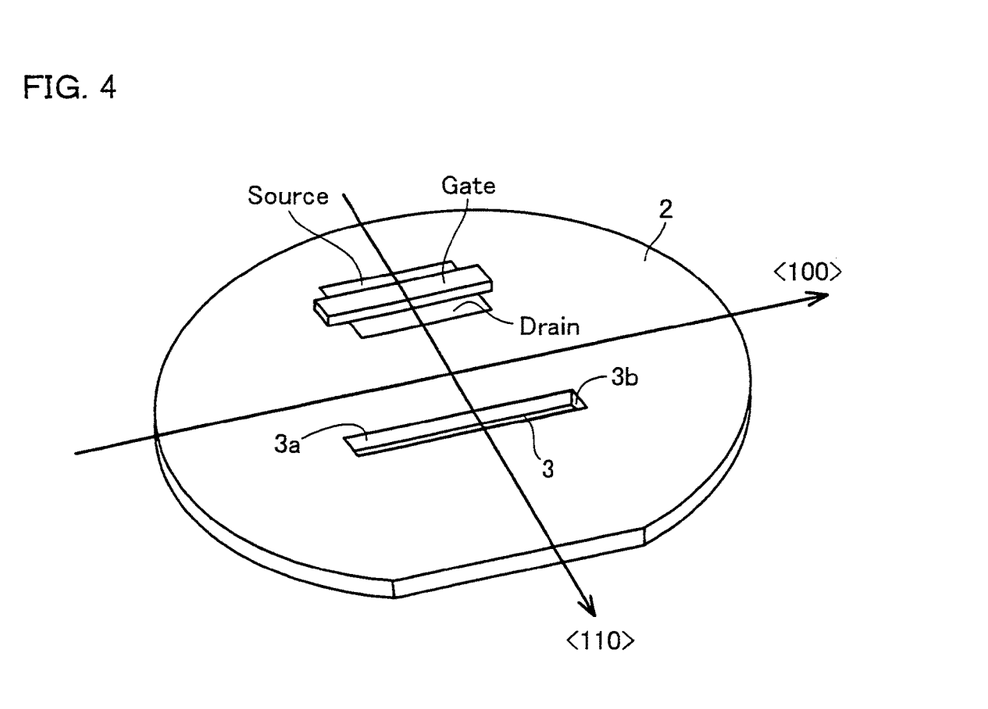
FIG. 4 An oblique view of the orientations of a p-channel trench power MOS transistor and a surface channel MOS transistor on the silicon wafer.

Mobility is higher in the silicon crystal <110> direction than in the silicon crystal <100> direction as shown in FIG. 3.

Therefore, the ON resistance of the p-channel trench power MOS transistor is lowered, specifically, by 30% to 40%.

The crystal face and direction in the present invention are given a margin of ±8° for the following reasons.

Mobility in a MOS transistor varies depending largely on the roughness of the surface of the silicon on which the inversion channel region is formed. The smaller the surface roughness, the greater the mobility.

The silicon surface roughness is caused by alkaline etching in the MOS transistor manufacturing process, for example, The magnitude of the roughness differs from one silicon crystal face to the other as described in non-patent document 1.

Specifically, the silicon crystal (110) face is not very rough. Roughness increases as a face inclines off the silicon crystal (110) face.

Accordingly, the ±8° margin is specified in the present invention as a range in which the silicon surface is not too rough to obtain desirable mobility.

In contrast, the surface channel MOS transistor is fabricated so that its inversion channel current flows in the surface part of the chip parallel to the surface of the chip. That allows for the direction of the inversion channel current to be set to any direction of the silicon crystal direction. In other words, the direction of the inversion channel current can be set to any orientation angle from 0° to 360° by rotating the orientation in which the surface channel MOS transistor is formed on the chip surface.

Therefore, the direction of the inversion channel current that is suitable to the surface channel MOS transistor to be formed is realized. A surface channel MOS transistor with a high operation speed is thus obtained.

The invention hence provides a power IC device containing a power MOS transistor with a low ON resistance and a surface channel MOS transistor with a high operation speed and also provides a method of manufacturing such a device.

Another power IC device according to the present invention is, to address the problems, characterized by including a surface channel MOS transistor and a p-channel trench power MOS transistor formed in a single chip, the chip having a surface which matches a silicon crystal (110) face, wherein: the p-channel trench power MOS transistor includes a trench formed vertically from the surface of the chip so that at least one of side walls of the trench matches the silicon crystal (110) face, a gate region formed in the trench, a trench power MOS transistor inversion channel region formed on a side wall part of the trench, a source region provided in a surface layer of the chip above the trench power MOS transistor inversion channel region, the source region being insulated from the gate region by a gate insulating film, and a drain region provided in a back surface layer of the chip below the trench power MOS transistor inversion channel region; a current from the source region to the drain region flows in the trench power MOS transistor inversion channel region in a silicon crystal <110> direction; and the surface channel MOS transistor includes a surface channel MOS transistor inversion channel region formed so that an inversion channel current flows in a surface part of the chip parallel to the surface of the chip.

Another method of manufacturing a power IC device according to the present invention is, to address the problems, characterized in that the power IC device includes a surface channel MOS transistor and a p-channel trench power MOS transistor formed in a single chip and in that the method includes the steps of: preparing a silicon wafer having a surface which matches a silicon crystal (110) face; in manufacture of the p-channel trench power MOS transistor, forming a trench vertically from the surface of the silicon wafer so that at least one of side walls of the trench matches the silicon crystal (110) face; forming a gate region in the trench; forming a trench power MOS transistor inversion channel region on a side wall part of the trench; forming a source region in a surface layer of the silicon wafer above the trench power MOS transistor inversion channel region, the source region being insulated from the gate region by a gate insulating film; forming a drain region in a back surface layer of the silicon wafer below the trench power MOS transistor inversion channel region, a current from the source region to the drain region flowing in the trench power MOS transistor inversion channel region in a silicon crystal <110> direction; and in manufacture of the surface channel MOS transistor, forming a surface channel MOS transistor inversion channel region so that an inversion channel current flows parallel to the surface of the silicon wafer.

According to the invention above, the chip surface on which the power IC device is formed is a silicon crystal (110) face. The structure further lowers the ON resistance of the power IC device because hole mobility is highest in the silicon crystal <110> direction.

The power IC device according to the present invention is preferably such that the surface channel MOS transistor is a p-type surface channel MOS transistor and has a surface channel MOS transistor inversion channel region formed so that an inversion channel current flows in the surface part of the chip parallel to the surface of the chip and in a direction not less than −8° and not more than +8° off the silicon crystal <110> direction.

The method of manufacturing a power IC device according to the present invention is preferably such that: the surface channel MOS transistor is a p-type surface channel MOS transistor; and in manufacture of the surface channel MOS transistor, the method includes the step of forming a surface channel MOS transistor inversion channel region so that an inversion channel current flows parallel to the surface of the silicon wafer and in a direction not less than −8° and not more than +8° off the silicon crystal <110> direction.

The structure enables the inversion channel region in the p-type surface channel MOS transistor to flow in the silicon crystal <110> direction ±8°. The p-type surface channel MOS transistor therefore has a high mobility, hence a high operation speed.

Figure 5:
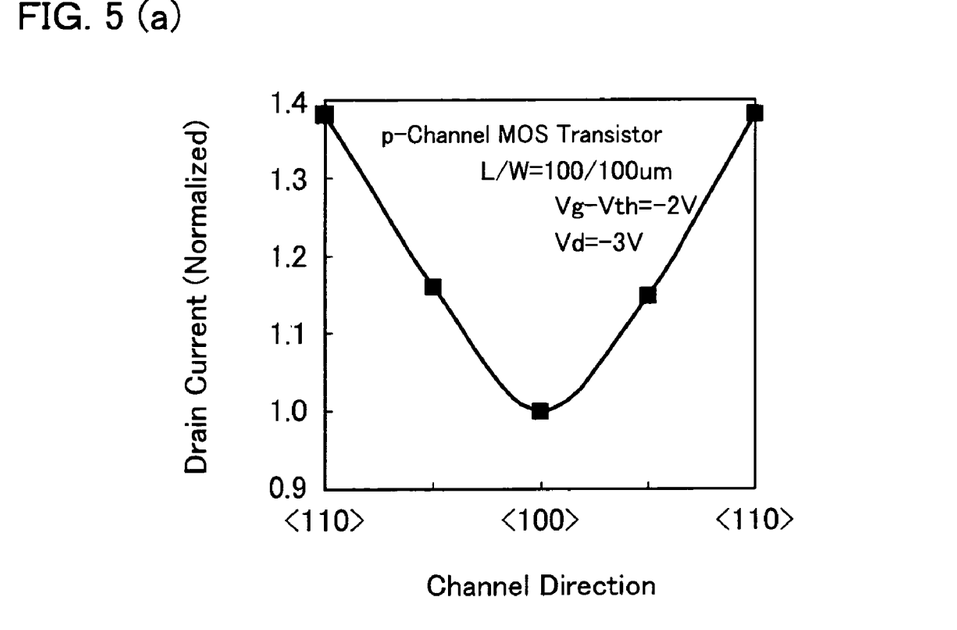
FIG. 5(a) An illustration of a relationship between a channel direction and a drain current in a p-channel MOS transistor.
FIG. 5(b) An illustration of a relationship between a channel direction and a drain current in an n-channel MOS transistor.

FIG. 5(a), as an example, shows a relationship between the magnitude of the drain current (current in the inversion channel region) of a p-type surface channel MOS transistor (p-channel MOS transistor) and silicon crystal direction. As illustrated in FIG. 5(a), the drain current more easily flows in the silicon crystal <110> direction than in the silicon crystal <100> direction. This is an indication that the operation speed of the p-type surface channel MOS transistor will improve if the drain current flows in the silicon crystal <110> direction.

It is therefore possible to, while maintaining the ON resistance of the p-channel trench power MOS transistor at a low level, simultaneously realize a high speed surface channel MOS transistor which controls its logic and other circuits.

The power IC device according to the present invention is preferably such that the surface channel MOS transistor is a p-type surface channel MOS transistor and has a surface channel MOS transistor inversion channel region formed so that an inversion channel current flows in the surface part of the chip parallel to the surface of the chip and in the silicon crystal <110> direction.

The method of manufacturing a power IC device according to the present invention is preferably such that: the surface channel MOS transistor is a p-type surface channel MOS transistor; and in manufacture of the surface channel MOS transistor, the method includes the step of forming a surface channel MOS transistor inversion channel region so that an inversion channel current flows parallel to the surface of the silicon wafer and in the silicon crystal <110> direction.

With the structure, if the inversion channel region flows in the silicon crystal <110> direction, the p-type surface channel MOS transistor has an improved hole mobility and a reduced ON resistance.

The power IC device according to the present invention is preferably such that the surface channel MOS transistor is an n-type surface channel MOS transistor and has a surface channel MOS transistor inversion channel region formed so that an inversion channel current flows in the surface part of the chip parallel to the surface of the chip and in a direction not less than −8° and not more than +8° off a silicon crystal <100> direction.

The method of manufacturing a power IC device according to the present invention is preferably such that: the surface channel MOS transistor is an n-type surface channel MOS transistor; and in manufacture of the surface channel MOS transistor, the method includes the step of forming a surface channel MOS transistor inversion channel region so that an inversion channel current flows parallel to the surface of the silicon wafer and in a direction not less than −8° and not more than +8° off a silicon crystal <100> direction.

The structure enables the inversion channel region in the n-type surface channel MOS transistor to flow in the silicon crystal <100> direction ±8°. The n-type surface channel MOS transistor therefore has a high mobility, hence a high operation speed.

FIG. 5(b), as an example, shows a relationship between the magnitude of the drain current (current in the inversion channel region) of an n-type surface channel MOS transistor (n-channel MOS transistor) and silicon crystal direction. As illustrated in FIG. 5(b), the drain current more easily flows in the silicon crystal <100> direction than in the silicon crystal <110> direction. This is an indication that the operation speed of the n-type surface channel MOS transistor will improve if the drain current flows in the silicon crystal <100> direction.

It is therefore possible to, while maintaining the ON resistance of the p-channel trench power MOS transistor at a low level, simultaneously realize a high speed surface channel MOS transistor which controls its logic and other circuits.

The power IC device according to the present invention is preferably such that the surface channel MOS transistor is an n-type surface channel MOS transistor and has a surface channel MOS transistor inversion channel region formed so that an inversion channel current flows in the surface part of the chip parallel to the surface of the chip and in a silicon crystal <100> direction.

The method of manufacturing a power IC device according to the present invention is preferably such that: the surface channel MOS transistor is an n-type surface channel MOS transistor; and in manufacture of the surface channel MOS transistor, the method includes the step of forming a surface channel MOS transistor inversion channel region so that an inversion channel current flows parallel to the surface of the silicon wafer and in a silicon crystal <100> direction.

With the structure, if the inversion channel region flows in the silicon crystal <110> direction, the n-type surface channel MOS transistor has an improved electron mobility and a reduced ON resistance.

The power IC device according to the present invention is preferably such that the p-channel trench power MOS transistor includes a plurality of parallel trenches formed so that each trench has a side wall with a planar direction parallel to a planar direction not less than −8° and not more than +8° off the silicon crystal (110) face.

The power IC device according to the present invention is more preferably such that the p-channel trench power MOS transistor includes a plurality of parallel trenches formed so that each trench has a side wall parallel to the silicon crystal (110) face.

The structure satisfies both the request for a high integration, hence high density, power IC device and the request for the flow of drain region.

The power IC device according to the present invention is preferably such that the surface channel MOS transistor is a surface channel CMOS (Complementary Metal Oxide Semiconductor) transistor formed by a pair of a p-type surface channel MOS transistor and an n-type surface channel MOS transistor.

The structure realizes a high integration surface channel MOS transistor and a simple manufacturing process.

The power IC device according to the present invention is preferably such that: the p-channel trench power MOS transistor includes, on inside walls of the trench, a gate insulating film having a first layer and a second layer; the first layer is formed by plasma oxidation of inside of the trench in an Ar or Kr radical atmosphere; and the second layer is stacked on the first layer by CVD oxide deposition.

The method of manufacturing a power IC device according to the present invention preferably includes, in manufacture of the gate insulating film of the p-channel trench power MOS transistor: the first layer forming step of forming a first layer by plasma oxidation of inside of the trench in an Ar or Kr radical atmosphere; and the second layer forming step of forming a second layer on the first layer by CVD oxide deposition.

The arrangement enables the power IC device according to the present invention to handle a large electric current. Specifically, the gate insulating film of the p-channel trench power MOS transistor can be readily given an increased thickness by forming the gate insulating film in these two separate steps because CVD oxide deposition, by which the second layer is formed, more readily forms a film with an increased thickness than plasma oxidation, by which the first layer is formed.

Therefore, dielectric breakdown is less hard to occur. The device is capable of handling a large electric current, for example, about 50 A.

The gate insulating film fabrication technique is more effective when the gate insulating film is formed on the silicon crystal (110) faces which match the inside walls of the trench.

The silicon crystal (110) face which happens to be an inside wall of the trench is easy to have a rough surface due to the fabrication of the trench. Accordingly, if a conventional technique is used to oxidize the inside walls of the trench to form the gate insulating film, the gate insulating film has a low breakdown voltage because the resultant gate insulating film is thin and fails to sufficiently cover up the irregularities on the silicon crystal (110) face that is beneath the gate insulating film. Specifically, the resultant gate insulating film is thin in some parts which act as breakdown points and lowers the breakdown voltage of the gate insulating film.

In the power IC device according to the present invention, however, the gate insulating film of the p-channel trench power MOS transistor has a sufficiently increased thickness because the gate insulating film is formed by plasma oxidation and subsequent CVD oxide deposition. Dielectric breakdown is therefore unlikely on the silicon crystal (110) faces which match the inside walls of the trench. As a result, large electric current can be handled.

The power IC device according to the present invention is preferably such that the first layer of the gate insulating film has a thickness of 5 to 8 nm; and the second layer of the gate insulating film has a thickness of 30 to 100 nm.

The structure renders the gate insulating film more effective in handling large electric current.

The power IC device according to the present invention is preferably such that the surface channel MOS transistor is provided to control the p-channel trench power MOS transistor.

In the arrangement, the surface channel MOS transistor is provided in the same chip to control the p-channel trench power MOS transistor. The single chip can secure safe operation of the p-channel trench power MOS transistor.

REFERENCE NUMERALS

1 Power IC Device
2 Silicon Wafer
2a Chip
2b Base Layer
2c Top Layer

3 Trench
3a Side Wall of Trench
3b Side Wall of Trench
10 p-Channel Trench Power MOS Transistor
11 Gate Region
12 Inversion Channel Region (Trench Power MOS Transistor Inversion Channel Region)
13 Drain Region
13a Drain Electrode
14 Source Region
14a Source Electrode
15 n-Well
16 Gate Insulating Film
17 Pad Oxide Film
20 Surface Channel MOS Transistor
21a Gate Electrode
22 Inversion Channel Region (Surface Channel MOS Transistor Inversion Channel Region)
23 Drain Region
23a Drain Electrode
24 Source Region
24a Source Electrode
25 High Voltage n-Well
26 p-Well
27 Gate Insulating Film
30 TA
32 Selectively Oxidized Film
34 CVD Oxide Layer
37 Polysilicon
38 Selectively Oxidized Polysilicon Film
39 Mask
40 Polysilicon Layer
44 Mask
46 Metal Electrode
50 p-Channel Power MOS Transistor
51 n-Channel Power MOS Transistor
52 Gate Step-up Circuit

BEST MODE FOR CARRYING OUT INVENTION

The following will describe an embodiment of the present invention in reference to FIGS. 1 to 9.

Figure 1:
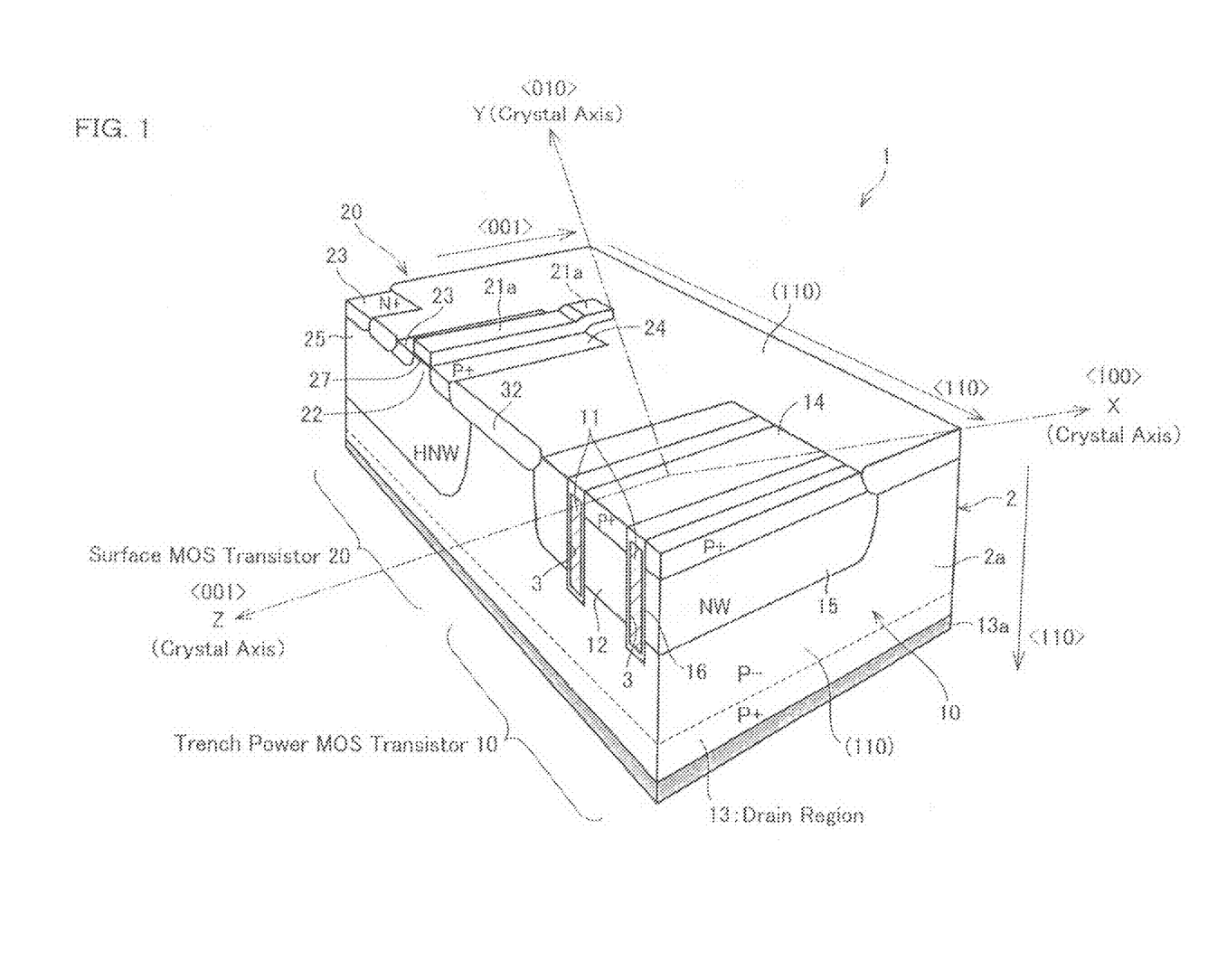
FIG. 1 An oblique view of major structural parts of a power IC device according to the present invention.

A power IC (Integrated Circuit; semiconductor integrated circuit) device 1 according to the present embodiment contains, in a single chip 2a, a p-channel trench power MOS (Metal Oxide Semiconductor) transistor 10 and a CMOS transistor as a surface channel MOS (Metal Oxide Semiconductor) transistor 20 as illustrated in FIG. 1.

The p-channel trench power MOS transistor 10 is fabricated in rectangular parallelepiped trenches 3 formed into a part of a surface layer of the chip 2a. More specifically, each trench 3 is provided so that two of its side walls match crystal (110) faces of the silicon wafer 2. Four trenches 3 are formed for each p-channel trench power MOS transistor 10. The four trenches are located close to each other and substantially parallel to the crystal <100> direction of the silicon wafer 2.

Gate regions 11 are formed to fill the trenches 3. An inversion channel region 12 is formed along side walls of the trenches 3.

A drain electrode 13a is formed in a back surface layer of the chip 2a. Meanwhile, a source region 14 is formed in the surface layer of the chip 2a above the gate regions 11 and the inversion channel region 12.

A drain region 13 is formed below a part of an n-well (NW) 15 which will act as the inversion channel region 12. The region 13 extends downward, reaching the drain electrode 13a.

In this structure, the channel current in the p-channel trench power MOS transistor 10 flows through the inversion channel region 12 in the thickness direction of the silicon wafer 2.

The CMOS transistor as the surface channel MOS transistor 20 is provided in a part, of the surface layer of the chip 2a, where no trenches 3 are present. The surface channel MOS transistor (CMOS transistor) 20 has a conventional structure. Specifically, an inversion channel region 22 is formed in the surface layer of the chip 2a, substantially parallel to the surface layer. A drain region 23 and a source region 24 are formed flanking the inversion channel region 22 across the region 22. A gate electrode 21a is formed above the inversion channel region 22.

Next will be described a method of manufacturing the power IC device 1 having the structure explained above, in reference to (a) to (c) of FIG. 6, (a) to (c) of FIG. 7, and (a) to (d) of FIG. 8.

Suitable conventional IC manufacturing processes may be used fabricate the p-channel trench power MOS transistor 10 and the CMOS transistor as the surface channel MOS transistor 20 according to the present embodiment.

The power IC device 1 according to the present embodiment is formed from the silicon wafer (base material) 2 which has a crystal (110) orientation surface.

Figure 6:
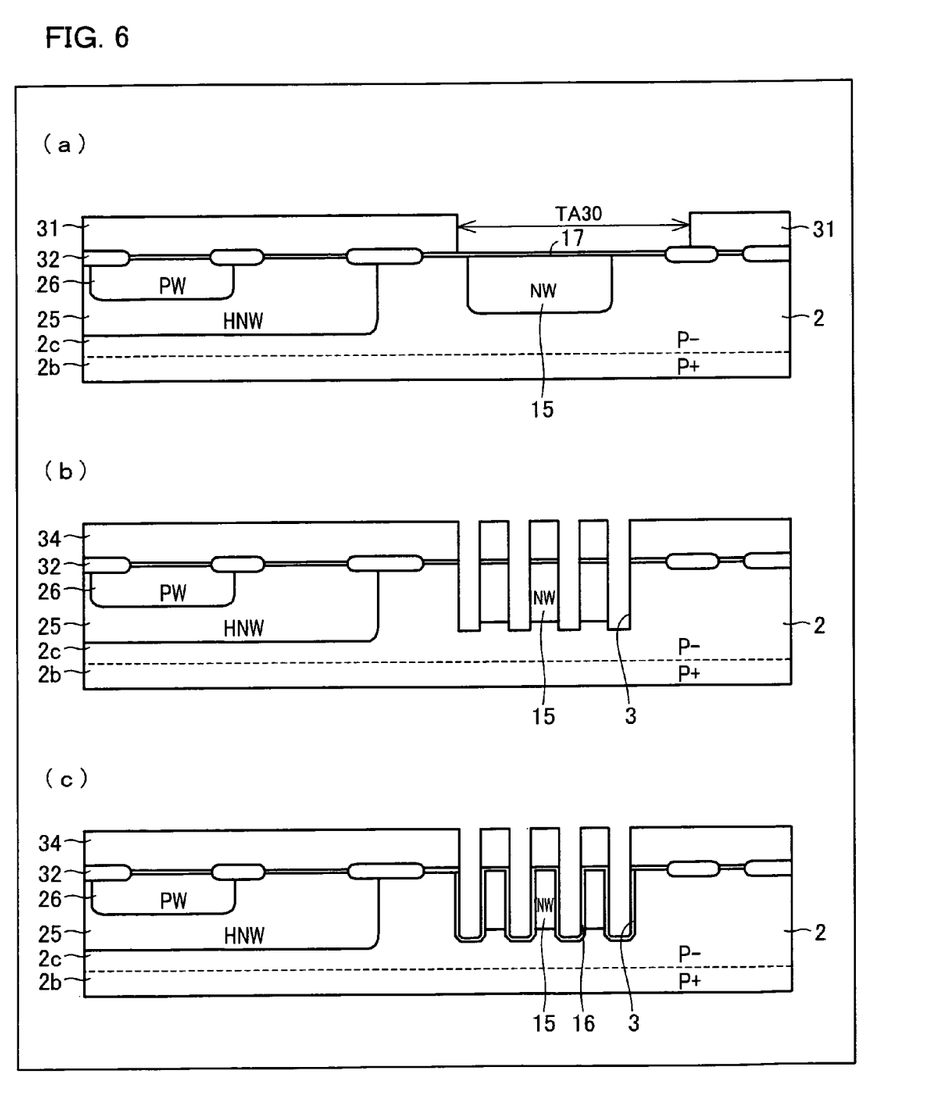
FIG. 6 Cross-sectional views of a major part of the power IC device, illustrating manufacturing steps of the device.

First, as shown in (a) of FIG. 6, the silicon wafer 2 is doped with boron to give the wafer 2 p-type conductivity. The doping is performed in such a manner as to provide two layers which differ in carrier concentration in the thickness direction, that is, a base layer 2b and a top layer 2c on the layer 2b, in the silicon wafer 2.

Specifically, the base layer 2b is doped so that it exhibits a resistivity of, for example, 0.005 to 0.01 Ω·cm.

Meanwhile, the top layer 2c is doped so that it exhibits a resistivity $P_{epi}$ and a thickness $X_{epi}$ which are dictated by electrical properties required of the p-channel trench power MOS transistor 10. Specifically, for example, if the p-channel trench power MOS transistor 10 is required to have a breakdown voltage of 80 V, the top layer 2c is doped to a depth of 10 to 15 μm so that it exhibits a resistivity of 5 Ω·cm. The top layer 2c in this structure is an epitaxial conduction layer.

Next, the surface of the epitaxial top layer 2c of the silicon wafer 2 is thermally oxidized. Subsequently, a high voltage n-well (HNW) 25 for the surface channel MOS transistor (CMOS transistor) 20 is formed. Specifically, the high voltage n-well 25 is formed by phosphorous doping to a depth of 5 to 8 μm.

Next, a p-well (PW) 26 for the surface channel MOS transistor (CMOS transistor) 20 is formed. Specifically, the p-well 26 is formed by doping the high voltage n-well 25 with boron to a depth of 1.5 to 3 μm and a dopant concentration of about 1 to $3 \times 10^{17}$ at/cm$^3$.

Next, an n-well (NW) 15 for the p-channel trench power MOS transistor 10 is formed. Specifically, the surface layer of the silicon wafer 2 is masked with a mask 31 which has an opening only for a TA (trench power MOS transistor area) 30 where the p-channel trench power MOS transistor 10 will be formed. After that, the wafer 2 is doped with phosphorous to a depth of 1.5 to 3 μm and a dopant concentration of about 0.5 to $2 \times 10^{17}$ at/cm$^3$.

Then, the high voltage n-well 25, the p-well 26, and the n-well 15 are formed by doping, which is followed by a thermal drive-in process at 1050° C. to form a finished doped region.

Next, a pad oxide film 17 is formed to a thickness of about 30 nm or less. Subsequently, a nitride film (not shown) is formed to a thickness of about 120 nm or less.

The mask 31 which is only open over the TA 30 is removed to expose the entire surface of the silicon wafer 2. In other words, of the surface of the silicon wafer 2, the entire surface of the active area where the p-channel trench power MOS transistor 10 and the surface channel MOS transistor (CMOS transistor) 20 will be formed is opened.

Subsequently, a selectively oxidized film (Local Oxidation of Silicon; LOCOS) 32 is formed. Specifically, the selectively oxidized film 32 is formed to a thickness of about 300 nm to 600 nm, which is intended to isolate the surface channel MOS transistor (CMOS transistor) 20. The selectively oxidized film 32 can be formed by a publicly known method.

Following the formation of the selectively oxidized film 32, a gate insulating film 27 is formed for the surface channel MOS transistor (CMOS transistor) 20. Specifically, the film 27 is formed by thermal oxidation of the silicon wafer 2, to a thickness of, for example, 14 to 20 nm which is a thickness dictated by drive voltage.

Next, as shown in (b) of FIG. 6, after an opening is formed in the TA 30, the wafer 2 is subjected to CVD (Chemical Vapor Deposition) oxidation to form a CVD oxide layer 34 of a thickness of about 300 nm. Subsequently, a trench pattern is formed in the CVD oxide layer 34 by a publicly known photoetching method. The trench pattern in this context refers to a boundary marker on the surface of the silicon wafer 2 which indicates a site where the trenches 3 will be formed.

The trench pattern is used as a mask in forming the trenches 3 by etching.

Four trenches 3 are formed for each p-channel trench power MOS transistor 10.

In addition, the trenches 3 are opened so that all of them have roughly a rectangular parallelepiped shape and extend in the thickness direction of the silicon wafer 2 down from the surface of the silicon wafer 2, that is, vertically down from the surface of the silicon wafer 2. Each trench 3 is about 0.3 to 1 μm wide.

Furthermore, the trenches 3 lie along the crystal <100> direction. Therefore, the four trenches 3 lie parallel to the crystal <100> direction.

As a result of the forming of the trenches 3 along the crystal <100> direction, the side walls of the trenches 3 match crystal (110) faces of the silicon wafer 2. The side walls of the trenches 3 in this context refer to the inside walls of the trenches 3 such that the planes containing the walls are approximately parallel to the thickness direction of the silicon wafer 2.

After forming the trenches 3 by etching, the CVD oxide layer 34 on the surface layer is removed. To reduce the surface roughness of the side walls of the trenches 3, the inside surfaces of the trenches 3 are thermally oxidized at 1050° C. to a thickness of 200 nm in wet environment. Thereafter, the thermally oxidized layers are removed.

Next, the inside surfaces of the trenches 3 are oxidized to form a gate insulating film 16 for the p-channel trench power MOS transistor 10 as shown in (c) of FIG. 6. The thickness of the gate insulating film 16 here is determined according to voltage condition and electrical property specifications required of the p-channel trench power MOS transistor 10. For example, if the transistor 10 is required to have a withstand voltage of 80 V, the gate insulating film 16 should be 40 to 80 μm thick.

The inside surface is oxidized, specifically, in two stages, that is, by combined use of silicon thermal oxidation and CVD oxide deposition, so that the two methods can complement each other and well address problems which would occur from the high surface roughness of the side walls of the trenches 3. Specifically, first, in the first stage of the oxidation, The inside surfaces of the trenches are subjected to plasma oxidation in an argon or krypton radical atmosphere to form a first layer of the gate insulating film 16 to a thickness of 5 nm to 8 nm. Next, in the second stage of the oxidation, the surfaces are subjected to CVD oxide deposition to form a second layer of the gate insulating film 16 to a thickness of 30 nm to 100 nm.

Figure 7:
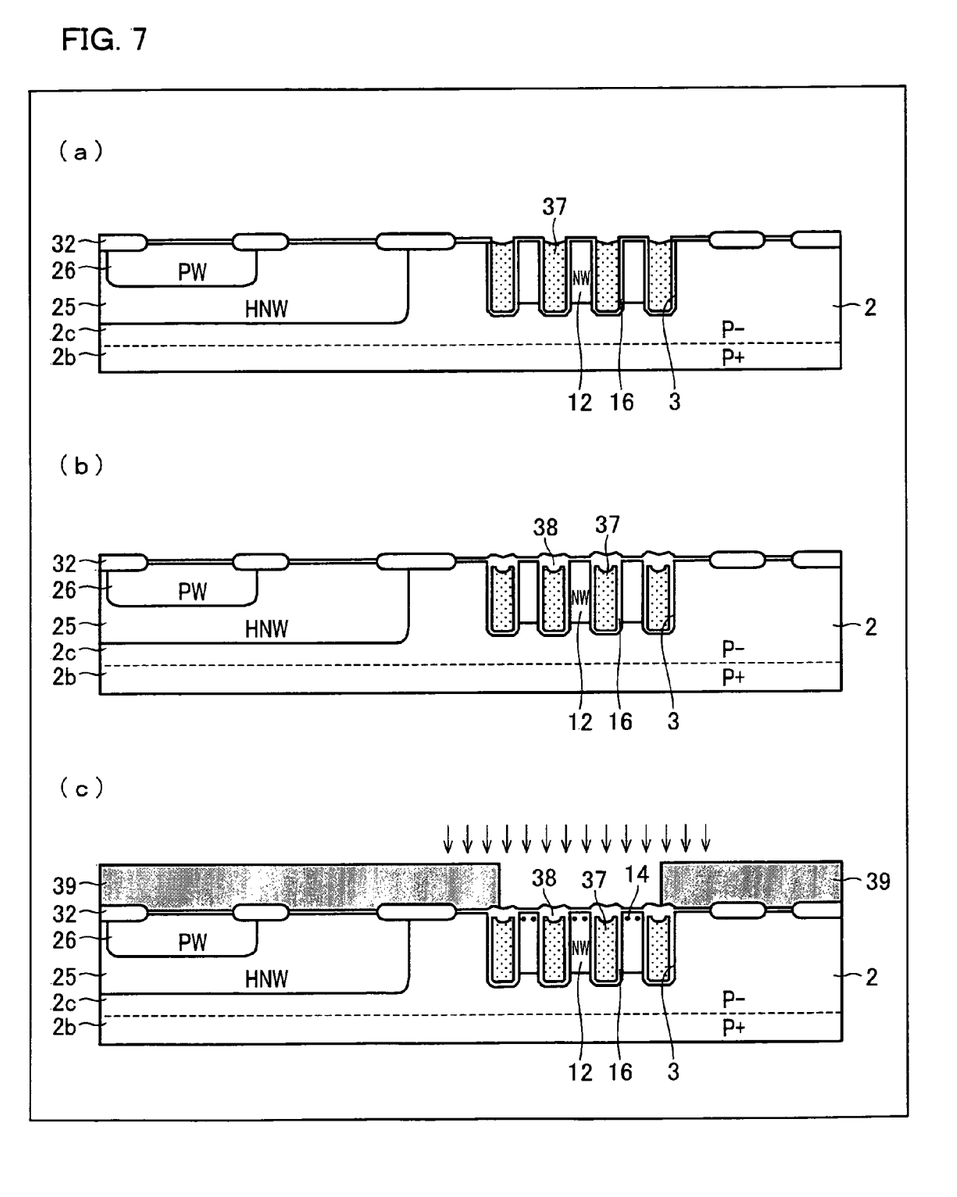
FIG. 7 Cross-sectional views of a major part of the power IC device, illustrating manufacturing steps of the device.

Next, gate regions 11 are formed inside the trenches 3 as shown in (a) of FIG. 7. Specifically, the trenches 3 in which the gate insulating film 16 has been formed are filled with polysilicon 37. Subsequently, the polysilicon 37 is doped with $POCl_3$ to form the gate regions 11 by imparting n-type conductivity to the polysilicon 37.

Next, the tops of the trenches 3 are planarized by removing excess polysilicon 37 that does not fit in the trenches 3. The planarization may be performed by, for example, etchback, chemical mechanical polishing (CMP), or a like publicly known method.

Next, the planarized tops of the gate regions 11 is insulated as shown in (b) of FIG. 7. Specifically, the top of the polysilicon filling in the gate regions 11 is oxidized to form a selectively oxidized polysilicon film 38 insulating the gate regions 11.

Next, a source region 14 for the p-channel trench power MOS transistor 10 is formed as shown in (c) of FIG. 7. Specifically, a mask 39 is formed which only has openings above the gate regions 11 and the n-well 15 of the p-channel trench power MOS transistor 10. Only the n-well 15 is selectively doped with boron to form the source region 14. The dopant concentration is set to, for example, $2\times10^{15}$ ions/$cm^2$.

Figure 8:
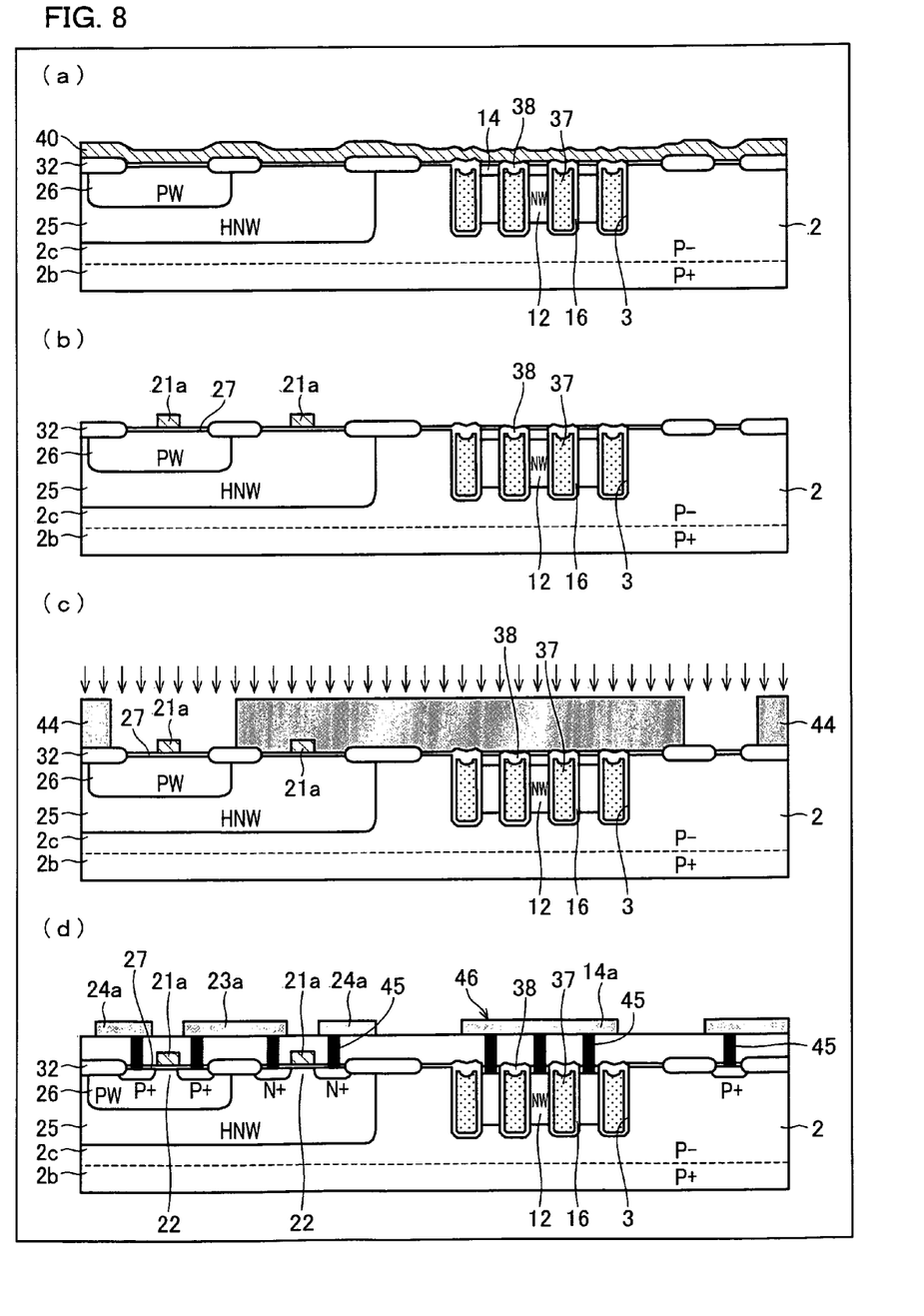
FIG. 8 Cross-sectional views of a major part of the power IC device, illustrating manufacturing steps of the device.

Next, the mask 39, covering the surface layer of the silicon wafer 2 except for the TA 30, is removed as shown in (a) of FIG. 8.

Subsequently, a polysilicon layer 40 is formed across the silicon wafer 2. The polysilicon layer 40 will be made into a gate electrode 21a for the surface channel MOS transistor (CMOS transistor) 20 by the following patterning and other steps. Specifically, first, the polysilicon layer 40 is doped with phosphorous to form an n-type semiconductor layer as a pre-stage to the formation of the gate electrode 21a for the surface channel MOS transistor (CMOS transistor) 20.

Next, the polysilicon layer 40 is patterned by photoetching to formed the gate electrode 21a for the surface channel MOS transistor (CMOS transistor) 20 as shown in (b) of FIG. 8.

All the succeeding process, until the completion of the power IC device 1, can be performed by publicly known, general techniques. The wafer 2 is selectively doped using a mask 44 as necessary to form a source region 24 and a drain region 23 of the surface channel MOS transistor (CMOS transistor) 20 as shown in (c) of FIG. 8. The doping is repeated for $n^+$ and $p^+$ regions to form the surface channel MOS transistor (CMOS transistor) 20 and the p-channel trench power MOS transistor 10.

Next, metal electrodes 46, such as a source electrode 14a for the p-channel trench power MOS transistor 10 and a drain and a source electrode 23a, 24a for the surface channel MOS transistor (CMOS transistor) 20, are formed by metal interconnects 45 or other publicly known, general technology as shown in (d) of FIG. 8. Steps are further implemented to complete the fabrication of the power IC device 1.

Next will be described a relationship between the surface channel MOS transistor (CMOS transistor) 20 and the p-channel trench power MOS transistor 10 in the power IC device 1.

The power IC device 1 according to the present embodiment contains the surface channel MOS transistor (CMOS transistor) 20 in the same chip 2a as the p-channel trench power MOS transistor 10.

The attributes of the p-channel trench power MOS transistor 10 controlled by the surface channel MOS transistor (CMOS transistor) 20 are not limitation in any particular manner. For example, current, voltage, and temperature may be controlled.

Figure 9:
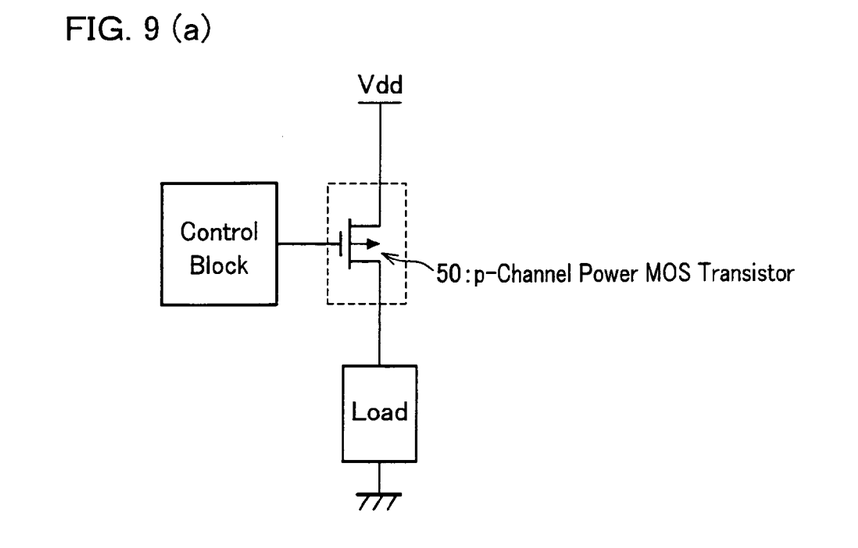
FIG. 9(a) A block circuit diagram for a power IC device containing a p-channel power MOS transistor.
FIG. 9(b) A block circuit diagram for a power IC device containing an n-channel power MOS transistor.

FIG. 9(*a*) is a block diagram of a high drive circuit incorporating the power IC device 1 according to the present embodiment. The high drive circuit includes a p-channel power MOS transistor 50, Vdd connected through the p-channel power MOS transistor 50, and a load. Furthermore, The p-channel power MOS transistor 50 is connected to a control block that controls the transistor 50.

Unlike the high drive circuit shown in FIG. 9(*b*) which includes an n-channel power MOS transistor 51, no gate step-up circuit 52 is provided between the p-channel power MOS transistor 50 and the control block in the high drive circuit of the present embodiment. The p-channel power MOS transistor 50, used as the power MOS transistor in the power IC device 1 according to the present embodiment, renders the gate step-up circuit 52 unnecessary.

The power IC device 1 according to the present embodiment is formed as detailed above so that the current in the inversion channel region 12 of the p-channel trench power MOS transistor 10 flows in the silicon crystal <110> direction and that the current in the inversion channel region 22 of the surface channel MOS transistor (CMOS transistor) 20 flows parallel to the chip surface and in the silicon crystal <110> direction.

Therefore, the embodiment realizes a power IC device 1 in which the power MOS transistor has a low ON resistance and the surface channel MOS transistor, especially, the p-MOS transistor in the CMOS transistor has a high operation speed, and also provides a method of manufacturing the device 1.

To describe it in more detail, in the power IC device 1 according to the present embodiment, the inversion channel region 22 of the p-channel trench power MOS transistor 10 is provided near side walls of the trenches 3 (vertical inversion channel region). The source region 14 and the drain region 13 are formed, flanking the inversion channel region 12, in the upper and lower parts of the silicon wafer 2 respectively. Therefore, the current induced in the inversion channel region 12 flows in the thickness direction of the silicon wafer 2. Meanwhile, the power IC device 1 according to the present embodiment is formed on the silicon wafer 2 which has a silicon crystal (110) orientation surface. The thickness direction of the silicon wafer 2 hence matches the silicon crystal <110> direction. Therefore, the current in the inversion channel region 12 flows in the silicon crystal <110> direction. As a result, mobility is high, and ON resistance is reduced by 30% to 40%, when compared with cases where the channel current flows in the silicon crystal <100> direction.

Furthermore, the inversion channel region 22 of the surface channel MOS transistor (CMOS transistor) 20 of the present embodiment is formed so that the current in the inversion channel region 22 flows in the silicon crystal <110> direction. Therefore, as mentioned above, especially, the p-MOS transistor has a high hole mobility and a high operation speed.

It would be appreciated from the discussion above that the power IC device 1 according to the present embodiment achieves both a reduced ON resistance in the p-channel trench power MOS transistor 10 and a high speed in the surface channel MOS transistor 20 controlling that logic circuit.

The p-channel trench power MOS transistor 10 in the power IC device 1 according to the present embodiment has the multiple, parallel trenches 3 with their depth matching the silicon crystal <100> direction. Therefore, the embodiment both achieves high integration of the power IC device 1 and secures the current flow path in the drain region 23.

The p-channel trench power MOS transistor 10 in the power IC device 1 according to the present embodiment the gate insulating film 16 made up of the first and second layers on the inside walls of the trenches 3. The first layer is formed by subjecting the inside of the trenches to plasma oxidation in an Ar or Kr radical atmosphere. The second layer is stacked on the first layer by CVD oxide deposition. The structure renders dielectric breakdown unlikely to happen, enabling handling of large electric current, even when the gate insulating film 16 is formed on silicon crystal (110) faces which form the inside walls of the trenches 3.

In the power IC device 1 according to the present embodiment, the first layer of the gate insulating film 16 of the p-channel trench power MOS transistor 10 is 5 to 8 nm thick, whereas the second layer of the gate insulating film is 30 to 100 nm thick. The structure renders the gate insulating film 16 more effective in handling large electric current.

The power IC device 1 according to the present embodiment includes the surface channel MOS transistor (CMOS transistor) 20 with which to control the p-channel trench power MOS transistor 10. With the configuration, the single chip 2a can secure safe operation of the p-channel trench power MOS transistor 10.

The present invention is not limited to the description of the embodiments above, but may be altered by a skilled person within the scope of the claims. An embodiment based on a proper combination of technical means modified suitably without departing from claims is encompassed in the technical scope of the present invention.

For example, the number of the trenches 3 is four in the embodiment. This is not the only possibility. The number may be one or any number greater than one other than four. With a fewer trenches 3, the power IC device 1 achieves a higher density. With more trenches 3, on the other hand, the drain region 13 allows greater current to flow therein. The number is preferably from two to ten to strike a good balance between high density for the power IC device 1 and great current flowing in the drain region 13. The number is more preferably from two to five to also simplify manufacturing steps and reduce manufacturing cost.

The gate insulating film 16 in the embodiment is formed by plasma oxidation and CVD oxide deposition. This is not the only possibility. For example, the film 16 may be formed only by plasma oxidation.

Transistors which are formed in the same chip 2a as the p-channel trench power MOS transistor 10, other than the surface channel MOS transistor 20 (other than the power transistor), are not limited in any particular manner. The power IC device according to the present invention 1 is formed on the silicon wafer 2 which has a crystal (110) orientation surface. Therefore, the n-channel MOS transistor formed on that silicon wafer surface is likely to have lower mobility than the n-channel MOS transistor formed on a silicon wafer which has a crystal (100) orientation surface. Accordingly, design may be altered as suited according to an objective, by changing the ratio of n-channel MOS transistors and p-channel MOS transistors, for example.

The inversion channel currents in the p- and n-type parts of the CMOS transistor as the surface channel MOS transistor 20 flow parallel to each other in the embodiment. However, this is not the only possibility. The inversion channel currents in the p- and n-type parts of the CMOS transistor as the surface channel MOS transistor 20 may flow, for example, perpendicular to each other.

The surface channel MOS transistor according to the present invention is not necessarily the CMOS transistor described above and may be, for example, a p-type surface channel MOS transistor or an n-type surface channel MOS transistor, or any combination of these two types of surface channel MOS transistors.

For example, if the inversion channel currents in the p- and n-type parts of the CMOS transistor flow in different directions or if the surface channel MOS transistor is not as the CMOS transistor, but, for example, as a p-type surface channel MOS transistor or an n-type surface channel MOS transistor as mentioned above, the inversion channel currents preferably flow in the directions detailed below.

Specifically, the inversion channel current in the p-type part preferably flows in a direction not less than −8° and not more than +8° off the silicon crystal <110> direction. Meanwhile, the inversion channel current in the n-type part preferably flows in a direction not less than −8° and not more than +8° off the silicon crystal <100> direction.

The inversion channel current in the p-type part more preferably flows in the silicon crystal <110> direction. The inversion channel current in n-type part more preferably flows in the silicon crystal <100> direction.

The chip surface is formed on a silicon crystal (110) face. The inversion channel regions of the surface channel MOS transistor and the p-channel trench power MOS transistor are provided so that the currents in the inversion channel regions flow in the silicon crystal <110> direction.

According to the power IC device and the method of manufacturing the device of the present invention, as described in the foregoing, the planar direction of the chip surface is a direction not less than −8° and not more than +8° off the silicon crystal (110) face, and the surface channel MOS transistor is fabricated so that the inversion channel current flows near the chip surface parallel to the chip surface.

Therefore, the invention realizes a power IC device and a method of manufacturing the device according to which the power MOS transistor has a low ON resistance and the surface channel MOS transistor has a high operation speed.

INDUSTRIAL APPLICABILITY

The present invention provides a p-channel trench power MOS transistor 10 and a surface channel MOS transistor 20 with high mobility and high withstand voltage and high withstand voltage property at low cost. In other words, the invention provides a power IC device 1 compatible with high current/high voltage. Therefore, the invention is applicable to circuits which require switching for high voltage and high current.

The invention claimed is:

1. A power IC device, comprising: a surface channel MOS transistor and a p-channel trench power MOS transistor formed in a single chip, the chip having a surface with a planar direction not less than −8° and not more than +8° off a silicon crystal (110) face, wherein: the p-channel trench power MOS transistor includes a rectangular parallelepiped trench formed vertically from the surface of the chip and substantially parallel to the crystal <100> direction of the chip so that at least two of side walls of the trench have a planar direction not less than −8° and not more than +8° off the silicon crystal (110) face, a gate region formed in the trench, a trench power MOS transistor inversion channel region formed on a side wall part of the trench, a source region provided in a surface layer of the chip above the trench power MOS transistor inversion channel region, the source region being insulated from the gate region by a gate insulating film, and a drain region provided in a back surface layer of the chip below the trench power MOS transistor inversion channel region; wherein the trench power MOS transistor inversion channel region is structurally configured such that a current from the source region to the drain region flows in a direction not less than −8° and not more than +8° off a silicon crystal <110> direction normal to the silicon crystal (110) face, and the surface channel MOS transistor includes a surface channel MOS transistor inversion channel region structurally configured so that an inversion channel current flows in a surface part of the chip parallel to the surface of the chip.

2. The power IC device according to claim 1, wherein the surface channel MOS transistor is a p-type surface channel MOS transistor and has a surface channel MOS transistor inversion channel region structurally configured such that an inversion channel current flows in the surface part of the chip parallel to the surface of the chip and in a direction not less than −8° and not more than +8° off the silicon crystal <110> direction.

3. The power IC device according to claim 1, wherein the surface channel MOS transistor is an n-type surface channel MOS transistor and has a surface channel MOS transistor inversion channel region structurally configured that an inversion channel current flows in the surface part of the chip parallel to the surface of the chip and in a direction not less than −8° and not more than +8° off a silicon crystal <100> direction.

4. The power IC device according to claim 1, wherein the p-channel trench power MOS transistor includes a plurality of parallel trenches, each trench having a side wall with a planar direction parallel to a planar direction not less than −8° and not more than +8° off the silicon crystal (110) face.

5. The power IC device according to claim 1, wherein the surface channel MOS transistor is a surface channel CMOS transistor including a pair of a p-type surface channel MOS transistor and an n-type surface channel MOS transistor.

6. The power IC device according to claim 1, wherein:
the p-channel trench power MOS transistor includes, on inside walls of the trench, a gate insulating film having a first layer and a second layer;
the first layer is formed by plasma oxidation of inside of the trench in an Ar or Kr radical atmosphere; and
the second layer is stacked on the first layer by CVD oxide deposition.

7. The power IC device according to claim 6, wherein:
the first layer of the gate insulating film has a thickness of 5 to 8 nm; and
the second layer of the gate insulating film has a thickness of 30 to 100 nm.

8. The power IC device according to claim 1, wherein the surface channel MOS transistor controls the p-channel trench power MOS transistor.

9. A power IC device, comprising a surface channel MOS transistor and a p-channel trench power MOS transistor formed in a single chip, the chip having a surface which matches a silicon crystal (110) face, wherein: the p-channel trench power MOS transistor includes a rectangular parallelepiped trench formed vertically from the surface of the chip and substantially parallel to the crystal <100> direction of the chip so that at least two of side walls of the trench match the silicon crystal [110] face, a gate region formed in the trench, a trench power MOS transistor inversion channel region formed on a side wall part of the trench, a source region provided in a surface layer of the chip above the trench power MOS transistor inversion channel region, the source region being insulated from the gate region by a gate insulating film, and a drain region provided in a back surface layer of the chip below the trench power MOS transistor inversion channel region; wherein the trench power MOS transistor inversion channel region is structurally configured such that a current from the source region to the drain region flows in a silicon crystal <110> direction; and the surface channel MOS transistor includes a surface channel MOS transistor inversion channel region structurally configured such that an inversion channel current flows in a surface part of the chip parallel to the surface of the chip.

10. The power IC device according to claim 9, wherein the surface channel MOS transistor is a p-type surface channel MOS transistor and has a surface channel MOS transistor inversion channel region structurally configured such that an inversion channel current flows in the surface part of the chip parallel to the surface of the chip and in the silicon crystal <110> direction.

11. The power IC device according to claim 9, wherein the surface channel MOS transistor is an n-type surface channel MOS transistor and has a surface channel MOS transistor inversion channel region structurally configured such that an inversion channel current flows in the surface part of the chip parallel to the surface of the chip and in a silicon crystal <100> direction.

12. The power IC device according to claim 9, wherein the p-channel trench power MOS transistor includes a plurality of parallel trenches, each trench having a side wall parallel to the silicon crystal (110) face.

13. The power IC device according to claim 9, wherein:
the p-channel trench power MOS transistor includes, on inside walls of the trenches, a gate insulating film having a first layer and a second layer;
the first layer is formed by plasma oxidation of inside of the trench in an Ar or Kr radical atmosphere; and
the second layer is stacked on the first layer by CVD oxide deposition.

14. The power IC device according to claim 13, wherein:
the first layer of the gate insulating film has a thickness of 5 to 8 nm; and
the second layer of the gate insulating film has a thickness of 30 to 100 nm.

15. A method of manufacturing a power IC device, wherein the power IC device includes a surface channel MOS transistor and a p-channel trench power MOS transistor formed in a single chip, said method comprising: preparing a silicon wafer having a surface with a planar direction not less than −8° and not more than +8° off a silicon crystal [110] face; in manufacture of the p-channel trench power MOS transistor, forming a rectangular parallelepiped trench vertically from the surface of the silicon wafer and substantially parallel to the crystal <100> direction of the chip so that at least two of side walls of the trench have a planar direction not less than −8° and not more than +8° off the silicon crystal (110]) face; forming a gate region in the trench; forming a trench power MOS transistor inversion channel region on a side wall part of the trench; forming a source region in a surface layer of the silicon wafer above the trench power MOS transistor inversion channel region, the source region being insulated from the gate region by a gate insulating film; forming a drain region in a back surface layer of the silicon wafer below the trench power MOS transistor inversion channel region, a current from the source region to the drain region flowing in the trench power MOS transistor inversion channel region in a direction not less than −8° and not more than +8° off a silicon crystal <110> direction; and in manufacture of the surface channel MOS transistor, forming a surface channel MOS transistor inversion channel region so that an inversion channel current flows parallel to the surface of the silicon wafer.

16. The method of manufacturing a power IC device according to claim 15, wherein:
the surface channel MOS transistor is a p-type surface channel MOS transistor; and
in manufacture of the surface channel MOS transistor, said method comprises a step of forming a surface channel MOS transistor inversion channel region so that an inversion channel current flows parallel to the surface of the silicon wafer and in a direction not less than −8° and not more than +8° off the silicon crystal <110> direction.

17. The method of manufacturing a power IC device according to claim 15, wherein:
the surface channel MOS transistor is an n-type surface channel MOS transistor; and
in manufacture of the surface channel MOS transistor, said method comprises a step of forming a surface channel MOS transistor inversion channel region so that an inversion channel current flows parallel to the surface of the silicon wafer and in a direction not less than −8° and not more than +8° off a silicon crystal <100> direction.

18. The method of manufacturing a power IC device according to claim 15, characterized by comprising, in manufacture of the gate insulating film of the p-channel trench power MOS transistor:
the first layer forming step of forming a first layer by plasma oxidation of inside of the trench in an Ar or Kr radical atmosphere; and
the second layer forming step of forming a second layer on the first layer by CVD oxide deposition.

19. A method of manufacturing a power IC device, wherein power IC device includes a surface channel MOS transistor and a p-channel trench power MOS transistor formed in a single chip, said method comprising: preparing a silicon wafer having a surface which matches a silicon crystal (110) face; in manufacture of the p-channel trench power MOS transistor, forming a rectangular parallelepiped trench vertically from the surface of the silicon wafer and substantially parallel to the crystal <100> direction of the chip so that at least two of side walls of the trench match the silicon crystal (110) face; forming a gate region in the trench; forming a trench power MOS transistor inversion channel region on a side wall part of the trench; forming a source region in a surface layer of the silicon wafer above the trench power MOS transistor inversion channel region, the source region being insulated from the gate region by a gate insulating film; forming a drain region in a back surface layer of the silicon wafer below the trench power MOS transistor inversion channel region, a current from the source region to the drain region flowing in the trench power MOS transistor inversion channel region in a silicon crystal direction; and in manufacture of the surface channel MOS transistor, forming a surface channel MOS transistor inversion channel region so that an inversion channel current flows parallel to the surface of the silicon wafer.

20. The method of manufacturing a power IC device according to claim 19, wherein:
the surface channel MOS transistor is a p-type surface channel MOS transistor; and
in manufacture of the surface channel MOS transistor, said method comprises a step of forming a surface channel MOS transistor inversion channel region so that an inversion channel current flows parallel to the surface of the silicon wafer and in the silicon crystal <110> direction.

21. The method of manufacturing a power IC device according to claim 19, wherein:
the surface channel MOS transistor is an n-type surface channel MOS transistor; and in manufacture of the surface channel MOS transistor, said method comprises the step of forming a surface channel MOS transistor inversion channel region so that an inversion channel current flows parallel to the surface of the silicon wafer and in a silicon crystal <100> direction.

* * * * *